United States Patent [19]

Scott et al.

[11] Patent Number: 4,795,917

[45] Date of Patent: Jan. 3, 1989

[54] LOW POWER HIGH VOLTAGE DRIVER CIRCUIT

[75] Inventors: Robert S. Scott; James E. Kohl, both of Schenectady, N.Y.

[73] Assignee: Pacific Bell, San Francisco, Calif.

[21] Appl. No.: 116,243

[22] Filed: Nov. 2, 1987

[51] Int. Cl.$^4$ .................. H03K 17/56; H03K 3/01
[52] U.S. Cl. .................... 307/270; 307/246
[58] Field of Search .............. 307/246, 270, 475

[56] References Cited

U.S. PATENT DOCUMENTS 3,790,812  2/1974  Fry ........................ 307/246
4,642,491  2/1987  Kenny et al. ............... 307/246

Primary Examiner—Stanley D. Miller
Assistant Examiner—Richard Roseen
Attorney, Agent, or Firm—Fitch, Even, Tabin & Flannery

[57] ABSTRACT

A circuit for driving an output between two voltage states in response to a control signal is disclosed. The circuit requires a very small amount of power in its quiescent state. The circuit comprises a first switch including first and second control terminals that provides a conductive path from a first source of potential to an output terminal when the potential difference between the control terminals is less than a first predetermined threshold value and for electrically isolating the first source of potential from the output terminal when the potential difference between the control terminals is greater than the first predetermined threshold value, and a second switch that provides a conductive path between a second source of potential and the output terminal when the first switch electrically isolates the first source of potential from the output terminal. The second switch electrically isolates the output terminal from the second source of potential when the first switch provides a conductive path from the first source of potential to the output terminal. The circuit also includes a control circuit for causing the potential difference between the first and second control terminals of the first switch to be greater than the first threshold value in response to a predetermined signal on the circuit input terminal and causes the potential difference between the first and second control terminals of the first switch to be less than the first threshold value when the predetermined signal is not present on the circuit input terminal.

29 Claims, 4 Drawing Sheets

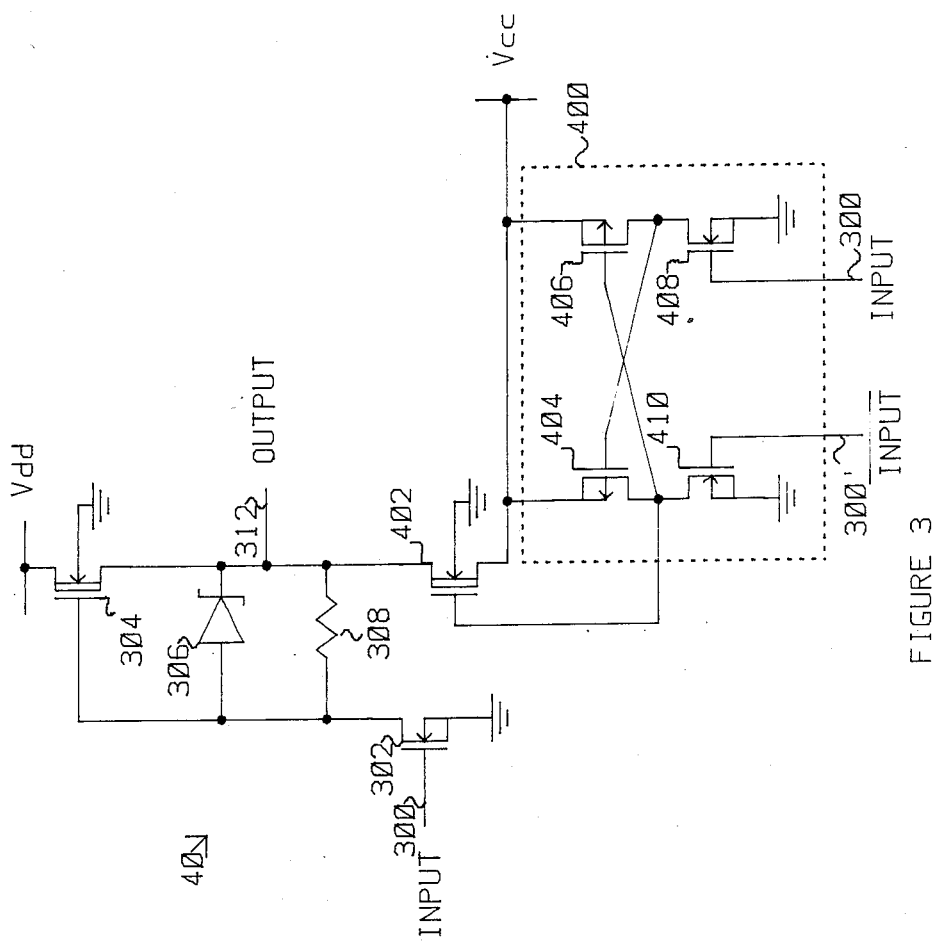

LOW POWER HIGH VOLTAGE DRIVER CIRCUIT

FIELD OF THE INVENTION

The present invention relates to high voltage output driver circuits, and more particularly to a driver circuit that can be utilized to drive piezoelectric bimorph elements.

BACKGROUND OF THE INVENTION

High voltage output driver circuits are useful for driving a variety of electrical loads such as wire dot print heads, micropumps of ink-jet printers, optical switches, piezoelectric relays, and the like. One particular type of piezoelectric relay utilizes a bimorph element.

Bimorph elements typically consist of two plates of piezoelectric material sandwiched between three planar electrodes. The piezoelectric material is typically a ceramic such as lead zirconate titanate. The first electrode is located on the outer surface of the first plate. The second electrode is sandwiched between the two plates. Finally, the third electrode is located on the outer surface of the second plate. When a high voltage is applied across one of the plates, the plate changes length. If, for example, only one of the two plates is subjected to such a voltage, the bimorph will bend in a direction perpendicular to the two plates.

This bending effect is used to construct relays. In a piezoelectric relay, one end of the bimorph is mounted in a cantilever manner over a surface. The bending motion of the bimorph is used to make or break a connection between two contacts. The first contact is mounted on the free end of the bimorph. The second contact is mounted on the surface. When a voltage is applied across the appropriate plate in the bimorph, the free end of the bimorph causes the contact mounted thereon to move with respect to the contact mounted on the surface. By applying a voltage across one of the two plates, the contacts can be made to move such that they are forced together, thus, completing an electrical circuit. When a voltage is applied across the other plate, the contacts move apart, thus breaking the circuit in question. In a double pole relay, this breaking motion can be used to complete a second circuit by forcing a second pair of contacts together. This second pair of contacts consists of a contact on the bimorph and a contact mounted on a second surface.

Piezoelectric relays of this type are particularly well suited to telecommunications applications. In particular, such relays provide an economical means for constructing cross-connect switches. In many telecommunication applications, switches are utilized which may contain thousands relays. If these relays are piezoelectric relays, the appropriate driving voltage must be maintained on each of these relays at all times. Eac relay requires a separate driving circuit which must be capable of supplying voltages of the order of a few hundreds of volts. Hence, it is very important that the power dissipation of each individual driving circuit be kept at a minimum.

Since each piezoelectric strip in a bimorph is electrically equivalent to a capacitor, the power dissipated by each driving circuit consists of the power needed to change the state of the relay, i.e., to charge and discharge the capacitors, and the power dissipated in the driving circuit itself in maintaining the voltage across each of the capacitors. This later power dissipation will be referred to hereinafter as the quiescent power dissipation. In practice, the state of each relay is changed very infrequently; hence substantially all of the power dissipation is associated with the quiescent power dissipation.

In addition to having low power dissipation, it is important that the driving circuit be capable of fabrication using integrated circuit technology. In many applications of interest, a large number of relays must be driven simultaneously. Therefore, a large number of driving circuits must be supplied. It would be advantageous to able to construct all of the driving circuits in question on a single integrated circuit chip. It is important, therefore, that the number of transistors needed for each driving circuit be minimized. Since high voltage transistors require a substantial silicon surface area on the integrated circuit chip, it is particularly important that the number of high voltage transistors be minimized.

Broadly, it is an object of the present invention to provide an improved high voltage driving circuit for switching a circuit element between two voltages.

It is a further object of the present invention to provide a high voltage driving circuit with minimal quiescent power dissipation.

It is yet another object of the present invention to provide a high voltage driving circuit that can be fabricated using a minimum number of high voltage transistors.

These and other objects of the present invention will become apparent to those skilled in the art from the following detailed description of the present invention and the accompanying drawings.

SUMMARY OF THE INVENTION

The present invention is directed toward a circuit for selectively connecting an output terminal to one of first and second sources of potential in response to the absence or presence of an input signal on a circuit input terminal.

The circuit comprises a first switching means including first and second control terminals for providing a conductive path from said first source of potential to said output terminal when the potential difference between said control terminals is less than a first predetermined threshold value and for electrically isolating said first source of potential from said output terminal when the potential difference between said control terminals is greater than said first predetermined threshold value. The circuit also includes second switching means for providing a conductive path between said second source of potential and said output terminal when said first switching means electrically isolates said first source of potential from said output terminal and for electrically isolating said output terminal from said second source of potential when said first switching means provides a conductive path from said first source of potential to said output terminal.

In addition, the circuit includes control means for causing the potential difference between said first and second control terminals of said first switching means to be greater than said first threshold value in response to a predetermined signal on said circuit input terminal and for causing the potential difference between said first and second control terminals of said first switching means to be less than said first threshold value when said predetermined signal is not present on said circuit input terminal.

Through the interaction of these elements, a high voltage driver circuit is realized that has low power requirements in that a very small bias current will allow the circuit to remain in the desired state. In addition, in one of the two states of the circuit, the bias current is supplied by a low voltage supply which further reduces the power dissipation. This circuit is easily interfaced to low voltage control inputs. This circuit is also effectively realized utilizing integrated circuit technology. Finally, the circuit is a simple one that can be manufactured economically.

BRIEF DESCRIPTION OF THE DRAWINGS

The advantages of the present invention will become apparent from the following detailed description and drawings in which:

FIG. 3 is a second embodiment of a high voltage driver circuit according to the present invention.

DETAILED DESCRIPTION OF THE INVENTION

Figure 1:
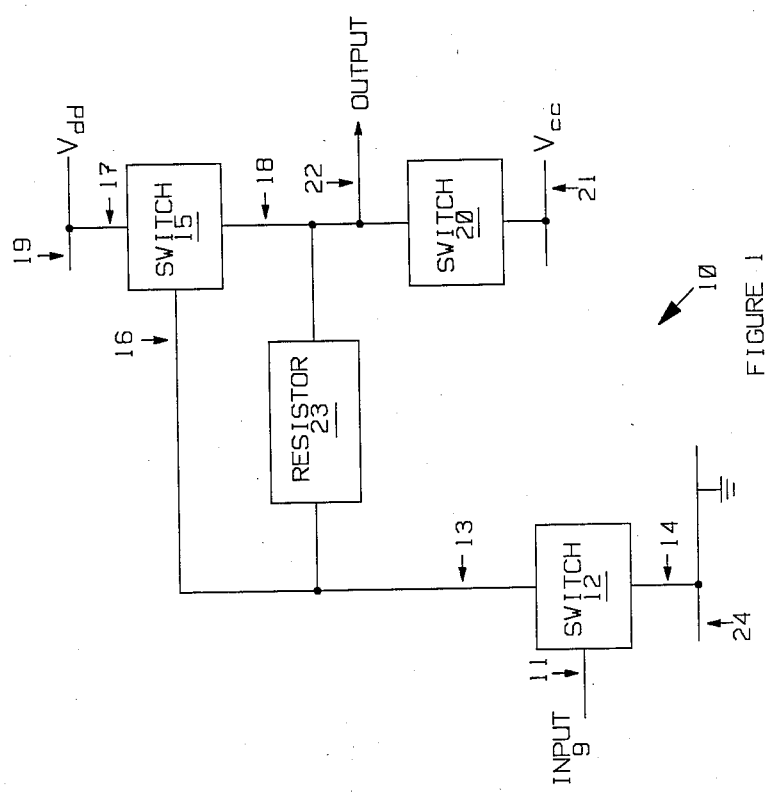
FIG. 1 is a block diagram of a high voltage driver circuit according to the present invention.

FIG. 1 is a block diagram of a high voltage driver circuit 10 according to the present invention. Circuit 10 shows the primary elements of the present invention. The circuit 10 couples a first power rail 19 or a second power rail 21 to a circuit output terminal 22 in response to a signal on a circuit control terminal 9. The circuit 10 includes first and second switches, 15 and 20, respectively. Switch 15 couples a first power rail 19 to output 22, and switch 20 couples the output 22 to the second power rail 21. The second power rail 21 is at a potential between the potential, Vdd, of the first power rail 19 and that of the ground power rail 24.

The circuit 10 also includes a resistor 23 which is coupled between the control terminal 16 and the output terminal 18 of the first switch 15 in series with a third switch 12. The input terminal 11 of switch 12 is coupled to the circuit control terminal 9 of circuit 10. The output terminal 14 of switch 12 is coupled to a ground power rail 24. The input terminal 11 of the switch 12 is coupled to the control terminal 16 of the first switch 15. The output terminal 18 of switch 15 is also coupled to the circuit output terminal 22.

To provide clarity to the following description of the invention, it should be understood that in the "active mode" of a switch the device is conducting a current between the input and output terminals of the device. Correspondingly, in the "inactive mode" of the device, the device is not conducting a current between the input and output terminals. Furthermore, it should be understood that the switch 12 is in an active mode when the potential between the control terminal 11 and the output terminal 14 is above a first threshold value and the switch 15 is in an active mode when the potential between the control terminal 16 and the output terminal 18 is less than a second threshold value. As will be discussed in more detail below, switch 20 is in the active mode when switch 15 is inactive and is in the inactive mode when switch 15 is active.

Referring to FIG. 1, when an input signal is provided to the control terminal 11 of the switch 12 that provides a potential that is higher than the threshold voltage of the switch 12, a conductive path is provided between the input terminal 13 and the output terminal 14 of the switch 12. This results in the control terminal of the switch 15 being coupled to the potential of the ground power rail 24 which will be referred to as ground hereinafter. It also results in a current flowing from the power rail 21 to ground through the switch 12 and the resistor 23. As a result, a potential difference of Vcc is applied between the control terminal 16 and the output terminal 18 of switch 15. Vcc is chosen to be greater than the threshold voltage of switch 15. Thus there is no conductive path provided by the switch 15.

Accordingly the voltage at circuit output terminal 22 will be held substantially at Vcc when the above-described input signal is applied to the input terminal 11 assuming there is a negligible voltage drop across the switch 20.

Since the switch 15 is inactive, the leakage current supplied by the power rail 19 which is necessary to maintain the circuit 10 in the low voltage state is less than Vdd divided by the impedance of the switch 15 in this "non-conducting" state. As will be discussed with respect to the illustrative embodiments of the remaining figures this current is quite small.

Since switch 20 is also active, power rail 21 will also provide a leakage current that is roughly equal to Vcc divided by the resistance of the resistor 23. As will be discussed in more detail below, the value of the resistor 23 may be chosen to be very high; hence, the current supplied by power rail 21 will also be very small. In addition, it should be noted that power rail 21 is at a much lower voltage than power rail 19, hence, the power drawn from the Vcc power supply per microampere of current through resistor 23 is substantially less than that drawn from the Vdd supply per microampere. Hence, resistor 23 can be significantly smaller than the impedance of a switch in the non-conducting state without markedly increasing the power requirements of the circuit.

Accordingly, by the above explanation it has been shown that circuit 10 provides one output voltage state when the input signal is above the threshold voltage of the switch 12 and that the corresponding bias current from the power rails 19 and 21 is extremely low.

If the signal to the control terminal of the switch 12 provides a potential that is below its threshold, it will stop conducting current. As a result, no current will flow through the resistor 23. Hence, the control terminal 16 of the switch 15 will be at the same potential as the output terminal 18 of the switch 15, thereby causing the switch 15 to provide a conductive path between the input terminal 17 and the output terminal 18. Accordingly the voltage at the output terminal 22 will be pulled up to the voltage potential of the first power rail 19. Under these conditions, the switch 12 and the switch 20 are not conducting. Switch 20 is included in the circuit to prevent a current from flowing between the power rails 19 and 21. The manner in which the state of switch 20 is coordinated with the state of switch 15 will be discussed in more detail with reference to the embodiments of the present invention shown in FIGS. 2 through 5.

In this state, the leakage current provided by the power rail 19 is the sum of two leakage currents. The first leakage current is that through switch 20 when said switch is in the non-conducting state. The second leakage current is equal to Vdd divided by the impedance of the series combination of the switch 12 and the resistor 23 when the switch 12 is not conducting. As will be discussed in more detail below, impedance of a switch in the non-conducting state is very large. Hence, even the sum of these two leakage currents is extremely small.

Since both switch 12 and switch 20 are not conducting, the power rail 21 is not required to provide any significant current in this state. Hence, the circuit 10 also provides a second voltage output state when the control circuit input signal is below the threshold voltage of the switch 12, and the corresponding current drawn from the power rails 19 and 21 is extremely low.

In summary, switch 15 provides a conductive path from the Vdd power rail 19 to output 22 or electrically isolates the Vdd power rail 19 from output 22 dependent upon the potential difference across terminals 16 and 18. Switch 20 provides a conductive path between the Vcc power rail 21 and output terminal 22 when switch 15 electrically isolates the Vdd power rail from output terminal 22. Switch 20 electrically isolates output terminal 22 from the Vcc power rail 21 when switch 15 provides a conductive path to the Vdd power rail 19. Switch 12 and resistor 23 act as a control circuit for controlling the state of switch 15. The control circuit provides the potential difference across terminals 16 and 18 of switch 15 which is greater than the threshold voltage of switch 15 if the control signal is present on input terminal 9 and causes the potential difference across the control terminals 16, 18 to be less than a certain value when the control signal is not present on the input terminal 9. As will become apparent from the discussion of the embodiments of the present invention shown in FIGS. 2-5, switch 20 may be controlled by the potential difference between output terminal 22 and the Vcc power rail 21. Alternatively, switch 20 may be controlled by the signal on input terminal 9.

Hence, it has been shown that a high voltage driver circuit is provided that has low power requirements when the circuit is in either of two states, provided the impedance of resistor 23 is sufficiently large and provided the impedances of switches 12 and 15 are sufficiently high when said switches are "non-conducting".

It will be apparent to one skilled in the electronic arts that the resistor 23 described above could be replaced by any circuit element which can maintain a potential difference of Vcc between the control and output terminals of switch 15 when connected between Vcc and ground while limiting the current drawn from the power rail 21 to an acceptable level. For example, a diode connected FET, i.e., a FET in which the gate is connected to the source, could be used in place of the resistor 23.

It will also be apparent to those skilled in the electronic arts that switches 15 and 20 may be any switching device which connects two power terminals together in response to a potential difference between two control terminals. In the case of switches 15 and 20 shown in FIG. 1, one of the control terminals is coincident with one of the power terminals. However, it will be appreciated that switching devices having completely independent control and power terminals may be used in a driving circuit according to the present invention.

Figure 2:
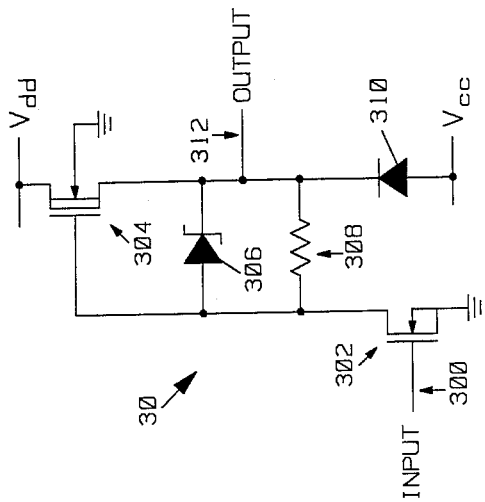
FIG. 2 is a circuit diagram of a first embodiment of a high voltage driver circuit according to the present invention.

FIGS. 2 through 5 are schematic diagrams of illustrative embodiments of the invention shown in FIG. 1. Referring first to FIG. 2 which illustrates a driver circuit 30 according to the present invention, circuit 30 includes two field effect transistors (FET) 302 and 304. The gate of the transistor 302 is coupled to an input terminal 300. Resistor 308 is coupled between the drain of the transistor 302 and the source of the transistor 304. The drain of the transistor 302 is coupled to the gate of the transistor 304. The source of the transistor 302 is coupled to ground.

The drain of the transistor 304 is coupled to a high voltage power supply, Vdd. The resistor 308 and the cathode of a diode 310 are coupled to the source of the transistor 304. Zener diode 306 is coupled between gate and source terminals of the transistor 304 to prevent damage to the transistor 304 by limiting its gate to source potential. The anode of the diode 310 is coupled to the low voltage power supply, Vcc. Finally, an output terminal 312 is coupled to the cathode of the diode 310.

In this embodiment, the transistor 302 is an n-channel MOS enhancement-mode field effect transistor (FET), while the transistor 304 is an n-channel MOS depletion-mode FET. Transistor 304 performs the functions of switch 15 discussed above with reference to FIG. 1, diode 310 performs the function of switch 20, resistor 308 performs the function of resistor 23 and transistor 302 performs the functions of switch 12. Vdd, as before mentioned, is the potential of the high voltage supply, typically 400 volts, while Vcc is the potential of the low voltage supply. Vcc must be greater than the threshold voltage of transistor 304 (typically 15 volts).

The driver circuit 30 operates in the following manner. Transistor 302 is turned on by raising the voltage of input terminal 300 above transistor 302's threshold voltage. This couples the gate of the transistor 304 to ground through the transistor 302. In addition, a current flows from the low voltage power supply, Vcc, to ground through the resistor 308. This insures that the potential difference between the source and gate terminals of transistor 304 is sufficient to keep transistor 304 off. This potential difference is essentially Vcc minus the voltage drop across diode 310. Accordingly, the output voltage in this state, referred to as the low voltage output state, will be held approximately to the value of Vcc minus the voltage drop across diode 310, provided Vcc minus the drop across diode 310 is greater than the threshold voltage of the transistor 304.

Since the transistor 304 is off, the leakage current supplied by the Vdd power supply to maintain the circuit in the low voltage state is less than Vdd divided by the impedance of the transistor 304 when said transistor is "non-conducting". It will be apparent to those skilled in the electronic arts that the transistor 304 can be constructed so as to have an impedance in excess of 100 megohms in this state. Hence, the current supplied by Vdd can be kept to below a few microamperes.

In this state of circuit 30, the Vcc voltage supply will also supply a leakage current that is roughly equal to Vcc divided by the resistance of the resistor 308. If the value of the resistor 308 is chosen to be a very high value, the amount of bias current supplied by Vcc power supply will be correspondingly small. As will be discussed in more detail below, the maximum allowable value for this resistance is determined by the impedance of the transistor 302 when it in the non-conducting state.

The resistance of the resistor 308 is chosen such that Vdd times the ratio of this resistance to the sum of this resistance and the impedance of the transistor 302 in the inactive state is less than the threshold voltage of the transistor 304. For the typical values discussed above, the resistor 308 can be as large as several megohms. Hence, the current supplied by the Vcc power supply can also be reduced to a few microamperes. Accordingly, circuit 30 provides a low voltage output state when the input signal is above the threshold value of the transistor 302 and the current drain from the voltage supplies, Vcc and Vdd, is extremely low.

Circuit 30 also provides a "high voltage output state" in which the potential on the output terminal 312 is substantially equal to Vdd. This state results when the signal to the input terminal 300 goes below the threshold voltage of the transistor 302. In this case, the transistor 302 will become inactive. Hence, the current flowing from the Vcc power supply through resistor 308 will be reduced to the leakage current through the transistor 302 when transistor 302 is "non-conducting".

Provided resistor 308 is small compared to $R_{302}$ times Vth/Vdd, where $R_{302}$ is the impedance of the transistor 302 in the inactive state and Vth is the threshold voltage of transistor 304, the potential difference across the resistor 308 will be much less than Vth. As a result, the potential difference between the gate and source of the transistor 304 will be below the threshold voltage of transistor 304. Since transistor 304 is a depletion-mode device it will become active and pull the voltage of output terminal 312 up to the potential of the high voltage supply, Vdd.

The current supplied by the Vdd and Vcc power supplies in this high voltage output state is also extremely low. In this state, transistor 302 and diode 310 will both be inactive. Since both of these devices are inactive, the Vcc supply is not required to supply any substantial current. The leakage current supplied by the Vdd power supply is less than Vdd divided by the impedance of the transistor 302 when the transistor 302 is inactive. Hence this current is less than a few microamperes.

Therefore, it has been shown through the above explanation that circuit 30 is one embodiment of a high voltage driver circuit which has low power requirements when the circuit is in either its high or its low output voltage state.

When driver circuit 30 switches from the high voltage output state to the low voltage output state, a potential of Vdd would appear across the resistor 308 were it not for zener diode 306. A potential of this magnitude could damage the transistor 304. Hence, as noted above, zener diode 306 is connected between the source and gate of transistor 304. The zener voltage of zener diode 306 is preferably between Vcc and the largest safe voltage which may be applied between the gate and source of the transistor 304.

As will be explained in more detail below, zener diode 306 also provides a current path around the resistor 308 which allows output terminal 312 to discharge more quickly than would be the case if all of the current were required to flow through resistor 308.

In circuit 30, the conductances of transistors 302 and 304 in the active state, i.e., when the transistors are conducting, are chosen to provide a predetermined charging rate for the load connected to the output terminal 312. As discussed above, circuit 30 may be used to drive a bimorph actuator element in a piezoelectric relay. It is important to drive such an element in a manner which ensures that the contacts of the relay are not separated either too slowly or brought together too fast. If the contacts are separated too slowly, welding of the contacts may result. If they are brought together too quickly, the contacts may bounce which results in undesired transients in the electrical circuit connected to said contacts.

It will be apparent to those skilled in the semiconductor arts that the physical parameters of transistors 302 and 304 may be chosen to provide a peak charging rate for the load connected to output terminal 312 which will result in the potential on output terminal 312 rising at a predetermined rate. For example, when circuit 30 is used to drive a piezoelectric relay, this rise time is adjusted to be about one millisecond.

As noted above with reference to the resistor 23 in driver circuit 10 shown in FIG. 1, it will be apparent to one of ordinary skill in the electronic arts that the resistor 308 may be replaced by any circuit element which provides a potential greater than or equal to the threshold voltage of transistor 304 when coupled between Vcc and ground through transistor 302 and diode 310, provided the current drawn by said circuit element is sufficiently small. For example, the resistor 308 can be replaced by a diode connected It will be recognized by one of ordinary skill in the art that certain modifications can be made to circuit 30 and its operation would still be within the spirit and scope of the present invention. For example, transistors 302 and 304 could be complementary devices. That is, transistor 304 could be a depletion-mode device with an inverter coupled thereto. Similarly, transistor 304 could be an enhancement-mode device with an inverter coupled thereto. Also, one skilled in the art recognizes that there are other active switching devices which could be utilized to perform the same functions as transistors 302 and 304.

Figure 4:
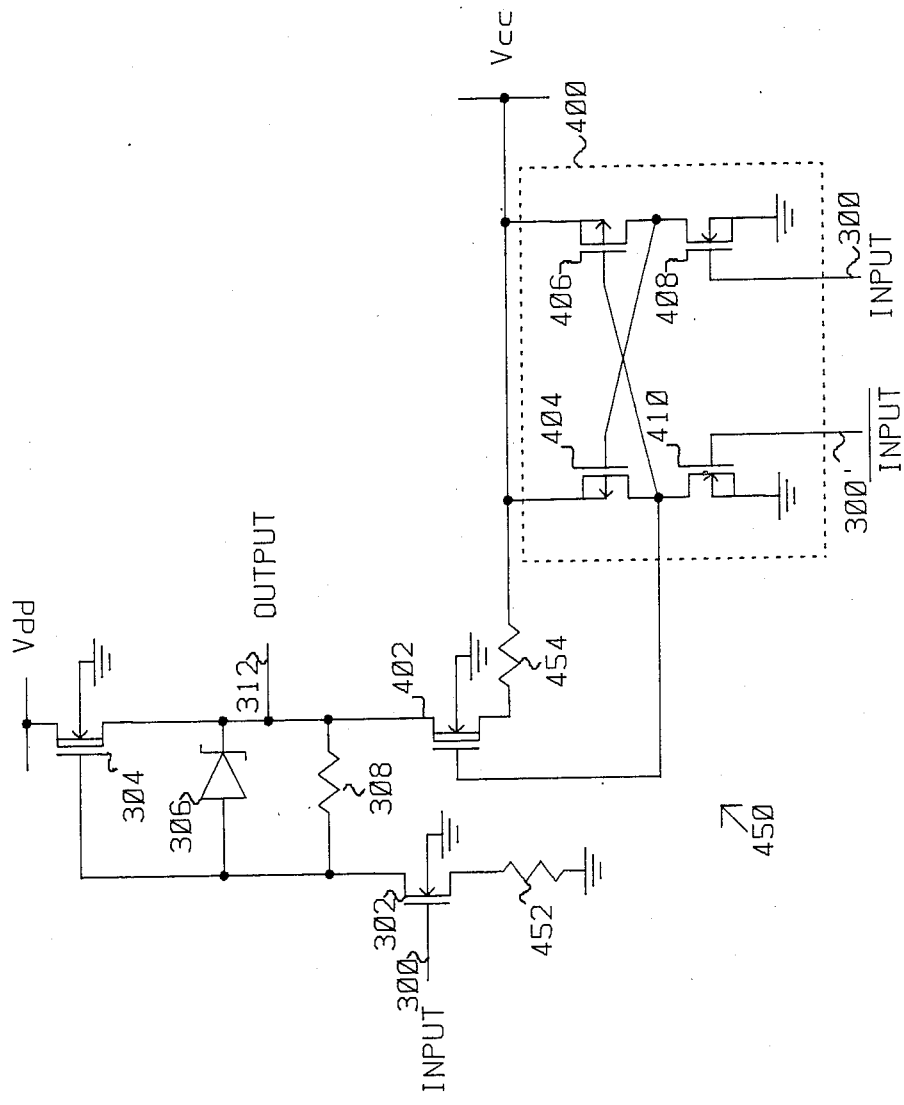
FIG. 4 is a third embodiment of a high voltage driver circuit according to the present invention.
Figure 5:
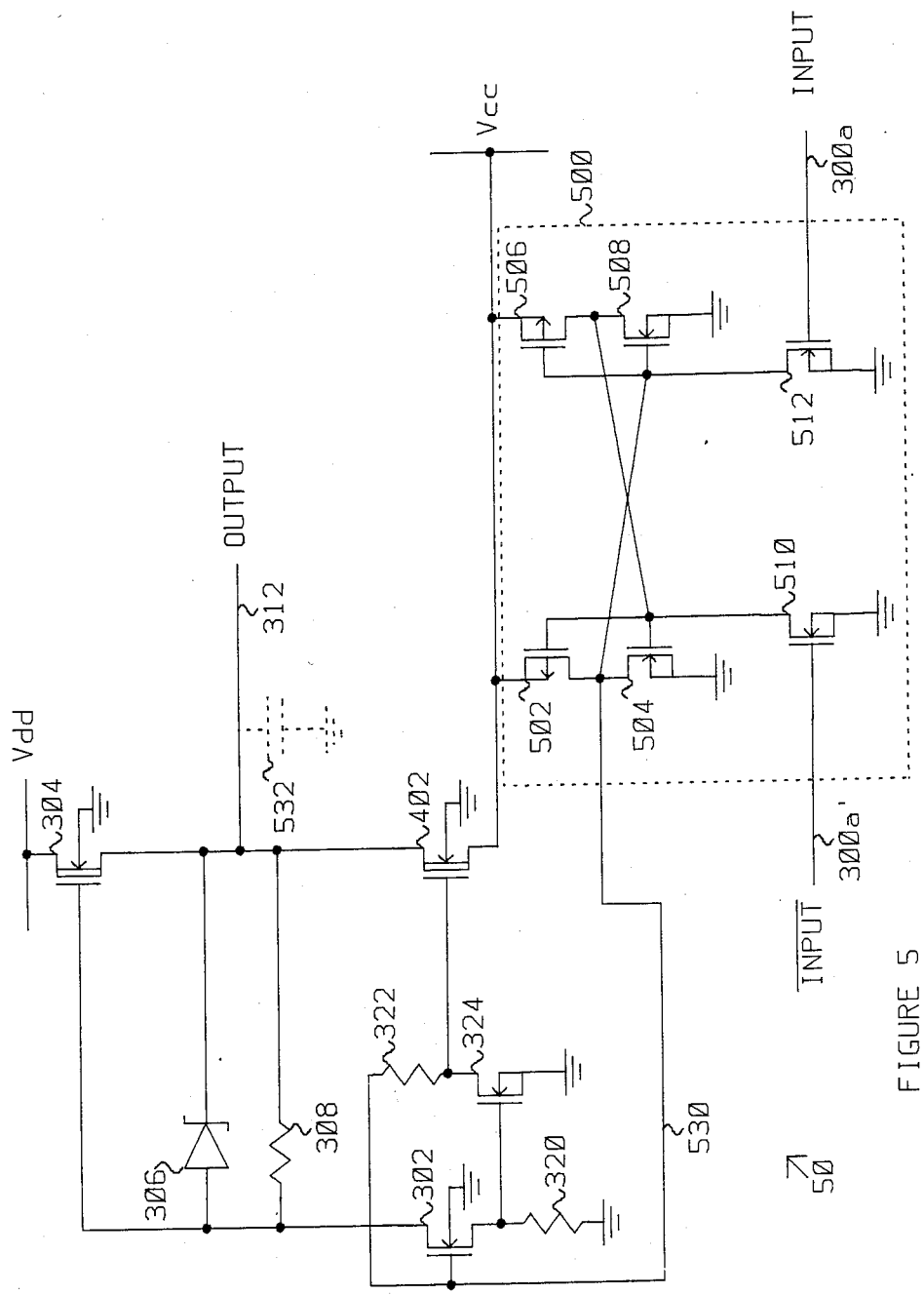
FIG. 5 is a fourth embodiment of a high voltage driver circuit according to the present invention.

FIGS. 3, 4, and 5 show illustrative embodiments of driver circuits which are compatible with high voltage integrated circuit technologies (HVIC) in which it is difficult to construct a diode such as that shown at 310. In some HVIC systems, diode 310 shown in FIG. 2 would include a parasitic PNP transistor which would conduct a large current from the Vcc supply to the substrate on which the circuit is constructed. Although this current would not prevent the circuit from functioning, it would greatly increase the power dissipation of the circuit which is undesirable. Hence, if a HVIC technology having this problem is to be used, the embodiments shown in FIGS. 3, 4, and 5 are preferred.

The elements of the circuits shown in FIGS. 3, 4, and 5 are substantially the same as those in the previously mentioned circuit 30 of FIG. 2 except as will be explained hereinbelow. Circuit elements which serve the same functions as the corresponding circuit elements shown in FIG. 2 have, accordingly, been labeled with the same numerals.

In the embodiments illustrated in FIGS. 3, 4, and 5 diode 310 is replaced by a transistor 402 and a control circuit. The control circuit depending on the voltage state of the driver circuit causes the transistor 402 to either conduct or not conduct current therethrough. The control circuits shown in these embodiments are powered from the Vcc power supply and are designed so as to draw at most a few microamperes of current from the Vcc supply.

Referring first to FIG. 3, transistor 402 is coupled between output terminal 312 and the Vcc power supply. The drain of the transistor 402 is coupled to output terminal 312. The source of transistor 402 is coupled to the Vcc power supply. Transistors 404, 410, 406 and 408 are coupled to form a control circuit 400. The output of control circuit 400 is coupled to the gate of transistor 402 and determines whether or not transistor 402 conducts a current.

It will be apparent to those skilled in the art that the control circuit 400 is constructed so that all current paths from the Vcc power supply to ground through circuit 400 include at least one FET transistor in the inactive state independent of the state of circuit 400.

The state of control circuit 400 is determined by signals on two terminals 300 and 300', the signal on terminal 300' being the complement of that on the terminal 300. Control circuit 400 provides a potential of either Vcc or ground to the gate of transistor 402. The source of transistor 404 is coupled to the gate of transistor 402, the gate of the transistor 406 and the drain of transistor 410.

The source of transistor 410 is coupled to ground and the gate of transistor 410 is coupled to input terminal 300' of circuit 400. The drain of transistors 406 and 408 are coupled to the Vcc voltage supply. The source of transistor 406 is coupled to the drain of transistor 408 and to the gate of transistor 404. The gate of transistor 408 is coupled to the input terminal of transistor 306 and the source of transistor 408 is coupled to ground.

In operation, an input signal is provided to the transistors 302 and 408 and the complement of that signal is provided to transistor 410 via input terminal 300'. If the input signal is above the threshold voltage of transistors 302 and 408, the gate of transistor 402 will be at Vcc and, since transistor 402 is a depletion mode FET, and its source is also at Vcc, transistor 402 will be active. As a result, output terminal 312 will be coupled to the Vcc power supply through transistor 402. Hence, the voltage on output terminal 312 will be approximately Vcc. The remaining portions of circuit 40 operate as above-described in circuit 30 of FIG. 2.

When the input signal is below the threshold voltage of transistors 302 and 408, both of these transistors are inactive. The complement of the input signal is also presented to transistor 410 via input terminal 300'; hence transistor 410 will be active. Thus, the gate of transistor 402 will be at ground while the source thereof will be at Vcc thereby causing transistor 402 to be non-conducting. The remaining portions of circuit 40 operate as above-described with reference to circuit 30 of FIG. 2. Thus, the output voltage on terminal 312 is approximately Vdd.

One skilled in the art recognizes that the transistors 402–408 of FIG. 3 can be active switching devices other than FET's.

As noted above, in some applications, it is important that the rise and fall times of the potential on the output terminal of the driver circuit be controlled. As described above, one method of controlling the rise and fall times is to adjust the physical parameters of the active switching elements to limit the current flow through said switching elements.

Alternatively, one could connect a resistance in series with the sources of transistors 302 and 402 shown in FIG. 3. A driver circuit so constructed is shown schematically in FIG. 4 as 450. Driver circuit 450 is identical to driver circuit 40 except that resistors 452 and 454 have been added. The resistances of these resistors are both small compared to resistor 308. Resistors 452 and 454 merely limit the rate at which the output line 312 can be discharged. In this regard, it is assumed that output terminal 312 is connected to a load having a finite capacitance.

This method for limiting the discharge time of output line 312 is satisfactory provided the transistor 402 does not include a parasitic transistor which would drain current from Vcc to ground. In some HVIC fabrication processes, the transistor 402 would include a parasitic transistor having its emitter connected to the gate of transistor 402, its base connected to the source of transistor 402 and its collector connected to ground. If the voltage drop across resistor 454 is greater than the voltage needed to turn on this parasitic transistor, then a large current will flow from Vcc to ground through this parasitic transistor whenever the transistor 402 is conducting. This is clearly to be avoided.

An alternative method of accomplishing the goal of limiting the discharge time of the output terminal 312 is to place a resistance in series with the source of the transistor 302 as discussed above, but omit the resistor 454. In this case, additional circuitry is provided to hold the transistor 402 in the nonconducting state until the output terminal 312 is discharged. An embodiment of a driving circuit according to the present invention which employs this technique is shown in FIG. 5 at 50. Driver circuit 50 utilizes a resistor 320 to regulate the discharge rate of the output terminal 312.

Referring to FIG. 5, transistors 512, 508, 506, 502, 504 and 510 act as a control circuit 500 which supplies a voltage of either Vcc or ground on line 530 in response to an input voltage level on terminal 300a and the complement of said input voltage level on terminal 300a'. Control circuit 500 is powered from the Vcc power supply; hence it is important that the current drawn by control circuit 500 be as small as possible. It will be apparent to one skilled in the electronic arts that control circuit 500 has at least one FET in the non-conducting state between the Vcc power supply and ground independent of the input voltage level. Hence, the current drawn by the control circuit 500 is at most a few microamperes.

Control circuit 500 operates as follows. When an input voltage level below threshold of the transistor 512 is applied to input terminal 300a, transistor 512 will become non-conducting. At the same time, transistor 510 will become conducting, since the complement of the voltage on terminal 300a is applied to terminal 300a' which is connected to the gate of transistor 510. As a result the line 530 will be coupled to the Vcc power supply. In this case, transistors 504 and 506 will be non-conducting. These non-conducting transistors prevent a current greater than the leakage current of a non-conducting FET from flowing from Vcc to ground through control circuit 500. As noted above, this current is very small.

Similarly, when an input voltage level above the threshold of transistor 512 is applied to input terminal 300a, line 530 will be coupled to ground. In this case, transistors 502 and 508 will be non-conducting. These non-conducting transistors prevent a current greater than the leakage current of a non-conducting FET from flowing from Vcc to ground through control circuit 500.

The potential on line 530 determines the state of transistors 302 and 402 under DC conditions. The transistor 302 is coupled to ground through a resistor 320 which has a much smaller resistance than resistor 308. The function of the resistor 320 will be explained in more detail below.

When line 530 is held at Vcc, transistor 302 will be conducting. Since resistor 320 is much smaller than resistor 308, the potential on the gate of transistor 324 will be below the threshold of the transistor 324; hence transistor will be non-conducting. As a result, the potential on the gate of transistor 402 will be equal to Vcc. Since transistor 402 is a depletion mode FET, this will cause transistor 402 to be conducting. Hence, both of the transistors 302 and 402 will be conducting which results in a current flowing through resistor 308 which provides a potential difference between the gate and source of transistor 304 which is sufficient to maintain said transistor in the non-conducting state. As noted above, this results in a potential of Vcc being coupled to output terminal 312.

When line 530 is at ground potential, transistors 302, 324, and 402 will all be non-conducting. As a result, only leakage current will flow through resistor 308. The potential difference between the gate and source of the transistor 304 produced by this leakage current is insufficient to maintain transistor 304 in the non-conducting state. Hence, output terminal 312 will be coupled to the Vdd power supply. Hence, driver circuit 50 operates in a manner analogous to driver circuit 40 shown in FIG. 3.

The operational differences between the driver circuits 40 and 50 are only evident when the driver circuits change state. In the driver circuit 40 the fall time for the potential on output terminal 312 when the output potential is switched from Vdd to Vcc is determined by the physical characteristics of the transistor 302. In driver circuit 50, the fall time in question is determined by resistor 320.

For the purposes of this discussion, it is assumed that the load connected to the output terminal 312 has a finite capacitance shown at 532 in phantom, and that Vdd is much larger than Vcc. These assumptions are correct when the load in question is a piezoelectric bimorph. Consider the case in which a potential of Vcc is suddenly applied to line 530. Prior to the application of this potential, output terminal 312 will be at Vdd. As soon as line 530 rises to Vcc, the transistor 302 will become conductive. A current will then flow from output terminal 312 through transistor 302 and resistor 320. This current will flow by way of two paths, zener diode 306 and resistor 308.

However, since the resistance of resistor 308 is very large, most of the current will flow through zener diode 306 as long as the potential on output terminal 312 is above the zener voltage. In effect, zener diode 306 will short-out the resistor 308 until the potential on output terminal 312 drops below the zener voltage. The zener voltage of zener diode 306 is chosen to be slightly larger than Vcc in the preferred embodiment of driver circuit 50. For example, a Vcc of 15 volts and a zener voltage of 20 volts are satisfactory when Vdd is 400 volts.

The current generated by the discharge of the capacitor 532 through resistor 320 is sufficient to raise the potential on the gate of the transistor 324 above its threshold voltage. Thus, the gate of transition 402 will be at ground. Hence, the transistor 402 will be prevented from conducting a current. Thus, all of the charge stored on the capacitor 532 will flow through resistor 320 via zener diode 306 until the potential on the terminal 312 drops to below the zener diode voltage. Hence, resistor 320 controls the falls time of the potential on the output terminal 312.

Once the potential on the output terminal 312 drops below the zener voltage of zener diode 306, the only current path will be through resistor 308. Since resistance of the resistor 320 is much less than the resistance of the resistor 308, there will now be insufficient voltage on the gate of the transistor 324 to maintain transistor 324 in a conducting state. As a result, the gate of transistor 402 will rise to Vcc, and transistor 402 will now begin to conduct a current which maintains the circuit in the low voltage output state described above.

One skilled in the art recognizes that transistors 324, 502-512 can be active switching devices other than FET's. In addition, it is clear that these devices can be replaced by complementary devices and those devices would still be within the spirit and scope of the present invention.

In accordance with the present invention, an improved high voltage output driver circuit is provided that has the advantage of a low power requirements for operation and is compatible with high voltage integrated circuit technology. The circuits of the above-mentioned embodiments are manufacturable and can be fabricated in integrated circuit form. These circuits have utility in driving electrical loads such as bimorph elements or the like and have particular utility when large matrices of these elements are utilized as relays. Finally these circuits will also be useful for switching arrangements associated with telecommunications systems.

Modifications to the present invention can be made and it would be understood by one ordinarily skilled in the art that those modifications would still be within the scope and spirit of the present invention. For example, the voltage supplies Vcc and Vdd can be a variety of values and still be within the spirit and scope of the present invention. Similarly, one ordinarily skilled in the art recognizes that the elements of the circuits 30, 40, and 50 that are shown coupled to a ground potential need only be coupled to a voltage potential that is lower than Vcc by an amount equal to the threshold voltage of the transistor 304. (coupling the Vdd supply to the output terminal to fall within the spirit of the present invention.) Finally the resistors 308, 320, 322, 452 and 454 could be of different values and types still be within the spirit and scope of the invention.

Accordingly, while this invention has been disclosed by means of specific illustrative embodiments, the principles thereof are capable of a wide range of modification by those skilled in the art and hence the invention is to be limited only by the scope of the following claims.

What is claimed is:

1. A circuit for selectively connecting an output terminal to one of first and second sources of potential in response to an input signal on a circuit input terminal, said first and second sources of potential being at first and second voltages, respectively, with respect to a third source of potential, said circuit comprising:

a first switching means including first and second control terminals, said first switching means for providing a conductive path from said first source of potential to said output terminal when the potential difference between said control terminals is less than a first predetermined threshold value and for substantially electrically isolating said first source of potential from said output terminal when the potential difference between said control terminals is greater than said first predetermined threshold value;

second switching means for providing a conductive path between said second source of potential and said output terminal when said first switching means substantially electrically isolates said first source of potential from said output terminal and for substantially electrically isolating said output terminal from said second source of potential when said first switching means provides a conductive path from said first source of potential to said output terminal; and control means for causing the potential difference between said first and second control terminals of said first switching means to be greater than said first threshold value in response to a predetermined signal on said circuit input terminal and for causing the potential difference between said first and second control terminals of said first switching means to be less than said first threshold value when said predetermined signal is not present on said circuit input terminal.

2. The circuit of claim 1 wherein the potential difference between said second source of potential and said third source of potential is greater than or equal to said first threshold voltage, wherein said first control terminal of said first switching means is coupled to said circuit output terminal, and wherein said control means comprises:

resistance means coupled between said first and second control terminals of said first switching means for providing a potential difference therebetween when a current flows through said resistance means, said potential difference being related to said current flow; and third switching means for providing a conductive path between said second control terminal and said third source of potential when said predetermined signal is present on said circuit input terminal and for electrically isolating said second control terminal from said third source of potential when said predetermined signal is not present on said circuit input terminal, the impedance of said conductive path provided by said third switching means being chosen such that the potential difference between said first and second control terminals is greater than said first threshold value, and the impedance of the path through said third switching means from said second control terminal to said third source of potential when said third switching means electrically isolates said second control terminal from said third source of impedance being chosen such that the potential difference between said first and second control terminals is less than said first threshold value.

3. The circuit of claim 2 wherein said resistance means comprises a resistor.

4. The circuit of claim 2 wherein said resistance means comprises a diode-connected field effect transistor.

5. The circuit of claim 1 wherein said second switching means comprises a diode.

6. The circuit of claim 1 wherein said second switching means comprises a switch for switching said second source of potential to said output terminal; and second control means coupled to said circuit input terminal, said second source of potential and said third source of potential for generating and applying a control signal to said switch when said predetermined signal is present on said circuit input terminal, said control signal causing said switch to switch said second source of potential to said output terminal when said control signal is applied to said switch, said switch isolating said output terminal from said second source of potential in the absence of said control signal.

7. The circuit of claim 2 wherein the impedance of said conductive path is chosen to limit the current flow through said third switching means to a predetermined maximum value.

8. The circuit of claim 2 further comprising means for limiting the potential difference between said first and second control terminals.

9. The circuit of claim 8 wherein said limiting means comprises a zener diode.

10. The circuit of claim 1 wherein said first switching means comprises a depletion mode field effect transistor.

11. The circuit of claim 2 wherein said third switching means comprises a enhancement mode field effect transistor.

12. The circuit of claim 6 wherein said switch comprises a enhancement mode field effect transistor.

13. A circuit for coupling either a first power rail or a second power rail to a circuit output terminal in response to a signal on a circuit control terminal, said circuit being adapted for coupling to said first and second power rails and a ground power rail, said second power rail being held at a potential between the potential of said first power rail, and the potential of said ground potential, said circuit comprising:

first active switch means, including input, output, and control terminals, for providing a conductive path between said input and output terminals when the potential difference between said output and control terminals of said first active switch means is less than a first threshold value which is less than or equal to the difference in potential between said second power rail and said ground power rail, the input terminal of said first active switch means being coupled to said first power rail and the output terminal of said first active switch means being coupled to said output terminal;

second active switching means including input, output, and control terminals, for providing a conductive path between said input and output terminals of said second active switch means when the potential difference between said output and control terminals is greater than a second threshold value, the output terminal of said second active switch means being coupled to said ground rail, the control terminal of said second active switch means being coupled to said circuit control terminal, the input terminal of said second active switching means being coupled to the control terminal of said first active switching means, and the output terminal of said second active switching means being coupled to said ground power rail;

two terminal resistance means, having one terminal thereof coupled to the output terminal of said first active switching means the other terminal thereof coupled to the control terminal of said first active switching means, for providing a potential difference between the output and control terminals of said first active switch means when current flows therethrough; and means coupled to said second power rail and to the output terminal of said first active switching means for preventing current from flowing between said first and second power rails when said first active switching means provides a conductive path between the input and output terminals of said first active switching means.

14. The circuit of claim 13 wherein said resistance means comprises a resistor.

15. The circuit of claim 13 wherein said resistance means comprises a diode-connected FET.

16. The circuit of claim 13 wherein said second active switching means further comprises means for limiting the current flowing between the input and output terminals thereof when said second active switching means provides a conductive path between said input and output terminals.

17. The circuit of claim 13 wherein said first active switching means comprises a depletion mode FET.

18. The circuit of claim 13 wherein said second active switching means comprises an enhancement-mode FET.

19. The circuit of claim 13 wherein said current flow preventing means comprises a diode.

20. The circuit of claim 13 wherein said current flow preventing means comprises:
- a third active switching means, including input, output, and control terminals, for providing a conductive path between said input and output terminals of said second active switching means when the potential difference between said output and control terminals is greater than a third threshold value, said output terminals of said third active switch means being coupled to said second power rail, and said input terminal of said third active switching means being coupled to said circuit output terminal; and
- control circuit means including input and output terminals, said input terminals being coupled to said circuit input terminal and said output terminal being coupled to the control terminal of said third active switching means, for providing a potential on said control circuit output means greater than or equal to said third threshold value when the potential on said circuit input terminal is greater than said second threshold voltage.

21. The circuit of claim 13 wherein said second active switching means further comprises means for limiting the current between said input and output terminals thereof.

22. The circuit of claim 21 wherein said means for limiting the current between the input and output terminals of said second active switching means is a resistor.

23. The circuit of claim 20 further comprising means for causing the potential difference between the output and control terminals of said third active switching means to be greater than said third threshold voltage when the potential on said circuit output terminal is above a predetermined potential.

24. The circuit of claim 13 further comprising means for limiting the potential difference between the control and output terminals of said first active switching means.

25. A high voltage driver circuit for connecting an output terminal to either a first voltage source or a second voltage source depending on the potential on an input terminal, the circuit comprising:
- a depletion-mode FET including gate, drain and source terminals, the drain terminal of the FET adapted to be coupled to the first voltage supply; the source terminal of said depletion-mode FET being coupled to the output terminal;
- an enhancement-mode FET including gate, drain and source terminals, the drain terminal of the enhancement-mode FET being coupled to the gate terminal of the depletion-mode FET, the source terminal of the enhancement-mode FET adapted to be coupled to a third voltage source having a voltage less than the second voltage source, and the gate of the enhancement-mode FET being coupled to said input terminal;
- resistance means coupled between the drain terminal of the enhancement-mode FET and the source terminal of the depletion-mode FET; and
- switching means coupled to said second voltage supply and coupled to said source terminal of the depletion-mode FET.

26. The circuit of claim 25 in which said switching means comprises a diode.

27. The circuit of claim 25 in which said switching means comprises a control circuit coupled to the input terminal; and an active switching means coupled between the output terminal and control circuit.

28. The circuit of claim 25 which further comprises means coupled between said gate and source terminals of said depletion mode FET for limiting a voltage potential between the gate and source terminals.

29. The circuit of claim 28 in which said limiting means comprises a zener diode.

* * * * *

UNITED STATES PATENT AND TRADEMARK OFFICE
CERTIFICATE OF CORRECTION

PATENT NO. : 4,795,917

DATED : January 3, 1989

INVENTOR(S) : Robert S. Scott, et al

It is certified that error appears in the above-identified patent and that said Letters Patent is hereby corrected as shown below:

Abstract, line 2, delete "states" and insert therefor --levels--.

Column 1, line 56, delete "Eac" and insert therefor --Each--.

Column 8, line 27, after "connected" insert therefor --FET.--.

Column 15, line 37, delete "terminals" and insert therefor --terminal--.

Column 15, line 43, delete "terminals" and insert therefor --terminal--.

Signed and Sealed this

Fourteenth Day of May, 1991

Attest:

HARRY F. MANBECK, JR.

*Attesting Officer*

Commissioner of Patents and Trademarks